United States Patent
Shiotani

(10) Patent No.: US 9,742,449 B2
(45) Date of Patent: Aug. 22, 2017

(54) WIRELESS RECEIVER

(71) Applicant: KABUSHIKI KAISHA AUDIO-TECHNICA, Machida-shi, Tokyo (JP)

(72) Inventor: Masaki Shiotani, Machida (JP)

(73) Assignee: KABUSHIKI KAISHA AUDIO-TECHNICA, Machida-Shi, Tokyo (JP)

( * ) Notice: Subject to any disclaimer, the term of this patent is extended or adjusted under 35 U.S.C. 154(b) by 0 days.

(21) Appl. No.: 15/295,195

(22) Filed: Oct. 17, 2016

(65) Prior Publication Data

US 2017/0111070 A1    Apr. 20, 2017

(30) Foreign Application Priority Data

Oct. 19, 2015   (JP) .................... 2015-205502

(51) Int. Cl.

| H04B 1/10 | (2006.01) |
|---|---|
| H04B 17/318 | (2015.01) |
| H03G 1/00 | (2006.01) |
| H03G 3/34 | (2006.01) |
| H04L 25/02 | (2006.01) |

(52) U.S. Cl.
CPC ......... *H04B 1/1027* (2013.01); *H03G 1/0041* (2013.01); *H03G 3/344* (2013.01); *H04B 17/318* (2015.01); *H04L 25/0232* (2013.01); *H04Q 2213/304* (2013.01)

(58) Field of Classification Search
CPC .. H04B 17/318; H04B 17/336; H04B 17/373; H04B 1/715; H04B 2001/7154

USPC .......................................... 455/218
See application file for complete search history.

(56) References Cited

U.S. PATENT DOCUMENTS

| 5,113,416 A * | 5/1992 | Lindell | H03J 1/0008 331/158 |
|---|---|---|---|
| 2005/0169410 A1 * | 8/2005 | Tanaka | H04L 1/203 375/346 |
| 2006/0267703 A1 * | 11/2006 | Wang | H03L 1/026 331/176 |

FOREIGN PATENT DOCUMENTS

| JP | 2006-270902 A | 10/2006 |
|---|---|---|
| JP | 2014-17782 A | 1/2014 |

* cited by examiner

*Primary Examiner* — Ajibola Akinyemi
(74) *Attorney, Agent, or Firm* — Manabu Kanesaka

(57) ABSTRACT

A wireless receiver includes an RSSI generation circuit that obtains RSSI output corresponding to a carrier strength level of a received RF signal; a lookup table from which a threshold value corresponding to temperature information from a temperature sensor is read based on the temperature information; a comparison circuit that generates comparison output when the RSSI output is below the threshold value read from the lookup table, in which the threshold value is one input, and the RSSI output from the RSSI generation circuit is the other input; and a muting circuit that closes a signal line of an audio signal demodulated from the RF signal, and cuts off output of the audio signal, based on the comparison output from the comparison circuit. The above configuration enables the wireless receiver to eliminate fluctuation of a reception reaching distance relative to temperature change, and ensure stable mute operation.

6 Claims, 5 Drawing Sheets

WIRELESS RECEIVER

RELATED APPLICATIONS

The present application is based on, and claims priority from, Japanese Application No. JP2015-205502 filed Oct. 19, 2015, the disclosure of which is hereby incorporated by reference herein in its entirety.

BACKGROUND OF THE INVENTION

Field of the Invention

The invention relates to a wireless receiver that receives a radio wave from, for example, a wireless microphone and demodulates an audio signal, and in particular relates to a wireless receiver capable of preventing fluctuation of a reception reaching distance (which determines an area where a combination system of a wireless microphone and a receiver can be used) due to temperature dependence of the receiver.

Description of the Related Art

For example, in a wireless receiver that receives a modulated RF signal (hereinafter referred to as an RF signal) transmitted from a wireless microphone and demodulates an audio signal, audibly unpleasant noise is generated when transmission of the RF signal (in particular Frequency-Modulated RF signal, hereinafter referred to as FM-RF signal) from the wireless microphone is stopped, or in a case where a reception state of the RF signal is deteriorated.

In order to remove such noise, this kind of wireless receiver includes a muting circuit (also referred to as a squelch circuit).

As one of the muting circuits, an RF muting circuit has been proposed that opens and closes a signal line of a demodulated signal according to a level of the received RF signal. The RF muting circuit operates to close the signal line of the demodulated audio signal and to reduce output of the audio signal when the level of the received RF signal is below a predetermined threshold value.

That is, to operate the RF muting circuit, a unit that obtains information (received signal strength indication: RSSI) according to the level of the received RF signal, and a comparison unit that compares a value of the RSSI with a predetermined threshold value are included.

However, the value of the RSSI largely depends on temperature of a front-end including an RF amplification circuit and a local oscillation circuit, and the like. Consequently, with the above-described muting circuit using the RSSI having the temperature dependence, an operating point of the muting circuit naturally fluctuates due to the temperature. For this reason, a reception reaching distance (which determines an area where the system can be used) of the combination system of the wireless microphone and the wireless receiver fluctuates (varies) due to operating temperature of the receiver.

In order to reduce such temperature dependence, a wireless receiver has been proposed in which a countermeasure is applied such as correction of the value of the RSSI corresponding to the operating temperature, and the receiver has been disclosed in, for example, JP 2006-270902 A (Patent Document 1) and JP 2014-017782 A (Patent Document 2).

The receiver disclosed in JP 2006-270902 A uses a constant current circuit in which an output current value is changed according to the temperature and corrects the temperature dependence of the RSSI, thereby suppressing variation of the operating point of the muting circuit according to the temperature.

The receiver disclosed in JP 2014-017782 A arranges, in the front-end, a correction circuit including a thermistor which changes its gain depending on the temperature, thereby correcting the temperature dependence of the RSSI similarly, and suppressing variation of the operating point of the muting circuit.

That is, both receivers correct the output of the RSSI having the temperature dependence with the constant current circuit or the circuit including the thermistor both having the temperature dependence similarly, and apply the value (voltage value) of the corrected RSSI to the comparison circuit, and compare the value with a fixed mute reference voltage (threshold voltage).

FIG. 8 is a graph describing mute operation in the conventional receiver, and the left vertical axis indicates the mute reference voltage, the right vertical axis indicates the RSSI voltage, and the horizontal axis indicates the operating temperature. A characteristic denoted by a indicates an output characteristic of the RSSI before correction of the temperature dependence, and a characteristic denoted by b indicates an example of an output characteristic of the RSSI after correction of the temperature dependence. A dashed line denoted by c indicates the fixed mute reference voltage (threshold voltage).

By the way, it is very difficult to perform correction so that the temperature characteristic is completely eliminated for the characteristic a of the RSSI before the correction, by using the constant current circuit or the like as disclosed in JP 2006-270902 A and JP 2014-017782 A, within a practical temperature range in which this kind of wireless receiver is used. That is, there are many examples in which the value of the RSSI becomes a gradient curve as illustrated by the corrected output characteristic b.

In this example, compared to an execution temperature t1 of the mute operation of the output a before the correction, an execution temperature of the mute operation of the output b after the correction increases to t2, and the reception reaching distance extends substantially. However, in the output b after the correction, the mute operation is executed at the temperature t2, but the mute operation is not executed at the temperature t1, and the reception reaching distance (which determines an area where the system can be used) fluctuates due to the temperature.

SUMMARY OF THE INVENTION

The invention has been made based on the above-described technical point of view, and an object thereof is to provide a wireless receiver capable of ensuring stable mute operation by suppressing fluctuation of a reception reaching distance (within which a system can be used) relative to temperature change, while using the RSSI output having a temperature characteristic for mute operation.

The wireless receiver according to the present invention that has been made to solve the above-described problem, includes: an RSSI generation circuit that generates RSSI output corresponding to a carrier strength level of a received RF signal; a lookup table from which a threshold value corresponding to temperature information from a temperature sensor is read out based on the temperature information; a comparison circuit that generates comparison output when the RSSI output is below the threshold value read from the lookup table or a value based on the threshold value, for which comparison circuit the threshold value or the value based on the threshold value is one input, and the RSSI output from the RSSI generation circuit is the other input; and a muting circuit that closes a signal line of an audio signal demodulated from the RF signal, and cuts off output of the audio signal, based on the comparison output from the comparison circuit.

In this case, in a preferable form, a configuration is adopted in which a practical temperature range in which the wireless receiver is used is divided into a plurality of stages, and the threshold value is stored in the lookup table in correspondence to each temperature range divided into the plurality of stages.

In another preferable form, a configuration is adopted in which the one input of the comparison circuit is a value linearly interpolated by using the threshold value read from the lookup table.

The wireless receiver according to the invention can suitably adopt a circuit configuration in which a thermistor is used for the temperature sensor.

An inclination of the above-described RSSI output relative to temperature and an inclination of the threshold value corresponding to the temperature information of the lookup table are set to be equal to each other. Further, an amount of temperature drift of the RSSI output from the normal temperature is set to be the same as an amount of temperature drift of the threshold value from the normal temperature corresponding to temperature information in the lookup table.

With the wireless receiver of the above-described configuration, the RSSI output corresponding to the carrier strength level of the received RF signal and the threshold value read from the lookup table are supplied to the comparison circuit. The level of the RSSI output is compared to the threshold value, and operation of the muting circuit is selected based on the comparison result.

In this case, in the wireless receiver according to the present invention, based on the temperature information from the temperature sensor, an appropriate threshold value is read from the lookup table and is compared to the RSSI output including the temperature characteristic.

Accordingly, the above configuration allows to cancel the temperature characteristic of the RSSI output by using the threshold value according to the temperature stored in the lookup table, and as a result, to achieve the mute operation that does not depend on the temperature.

Thus, the wireless receiver can be provided which enables to eliminate the fluctuation of the reception reaching distance (which determines an area where the system can be used) relative to the temperature change and to ensure the stable mute operation.

DESCRIPTION OF THE PREFERRED EMBODIMENTS

Figure 1:
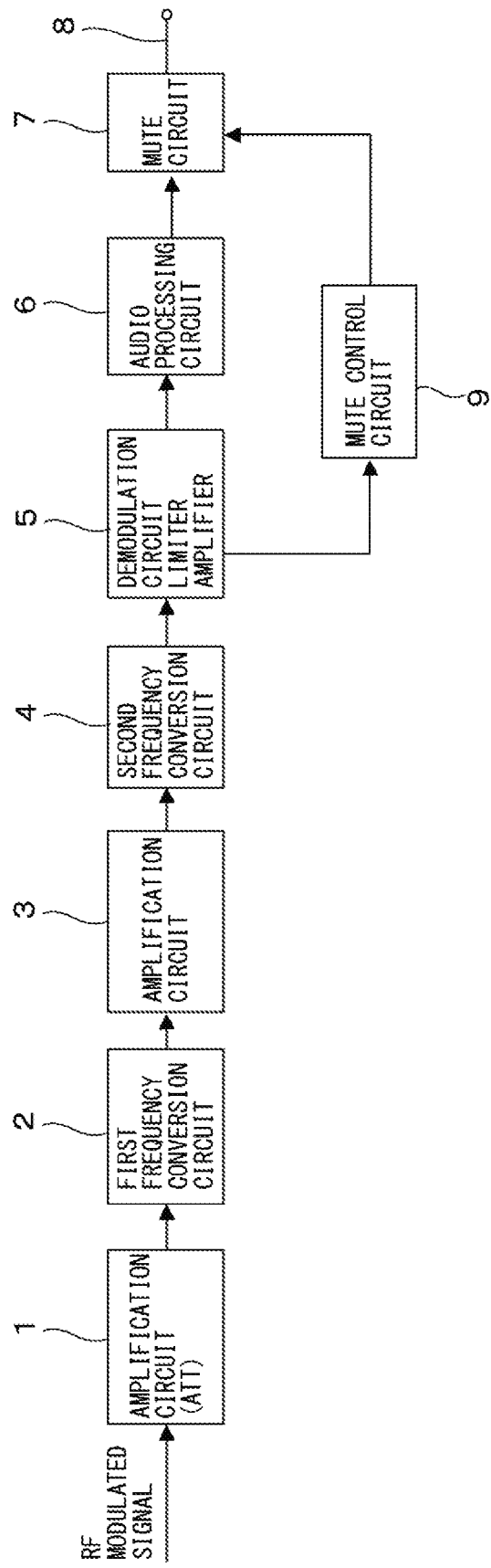
FIG. 1 is a block diagram illustrating an example of a wireless receiver according to the invention.

A wireless receiver according to the present invention will be described based on embodiments illustrated in the drawings.

An example described below is a wireless receiver that receives an FM-RF signal from a wireless microphone as a transmitter and demodulates an audio signal, and FIG. 1 illustrates an entire configuration of the wireless receiver in a block diagram.

In FIG. 1, an RF signal from a receiving antenna (not shown) is fed to an RF amplification circuit 1. The RF signal from the RF amplification circuit 1 is fed to a first frequency conversion circuit 2.

The first frequency conversion circuit 2 receives a signal from a first local signal oscillator (not shown) by a PLL synthesizer, for example, and generates a first intermediate frequency signal (first IF signal) from the RF signal and a first local signal. That is, by selection of the first local signal by the PLL synthesizer, the first intermediate frequency signal corresponding to a particular receiving frequency is generated, and is supplied to an intermediate frequency amplification circuit 3.

The first IF signal amplified by the intermediate frequency amplification circuit 3 is supplied to a second frequency conversion circuit 4. The second frequency conversion circuit 4 receives a fixed local signal from a second local signal oscillator (not shown), and generates a second intermediate frequency signal (second IF signal) from the first intermediate frequency signal (first IF signal) and a second local signal. That is, the wireless receiver adopts a double superheterodyne system.

The second intermediate frequency signal (second IF signal) is demodulated to the audio signal by a demodulation circuit 5 including a limiter amplifier, and is supplied to a muting circuit 7 through an audio processing circuit 6. The muting circuit 7 has a function of opening and closing a signal line of a demodulated signal (audio signal), after receiving a control signal from a mute control circuit 9 which will be described later. The demodulated signal passing through the muting circuit 7 is outputted to an audio output terminal 8.

Meanwhile, an FM-IF signal is supplied from the demodulation circuit 5 to the mute control circuit 9, and the control signal from the mute control circuit 9 is supplied to the above-described muting circuit 7.

Figure 2:
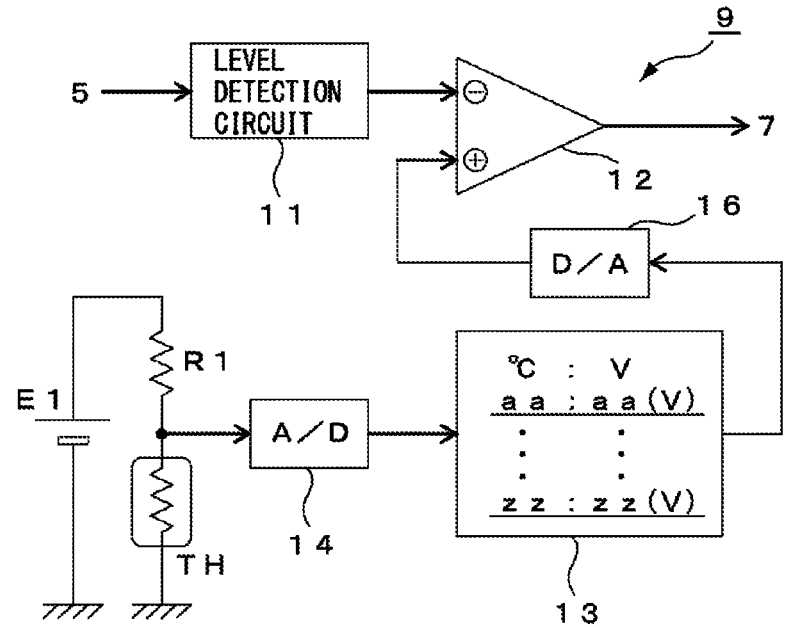
FIG. 2 is a block diagram illustrating a first example of a mute control circuit in the wireless receiver illustrated in FIG. 1.

FIG. 2 illustrates a first configuration example of the mute control circuit 9 shown in FIG. 1. The mute control circuit 9 includes a level detection circuit 11 that receives the FM-IF signal from the demodulation circuit 5 illustrated in FIG. 1, and performs level detection of the signal. Level detection output from the level detection circuit 11, that is, the RSSI output corresponding to the carrier strength level of the RF signal is supplied to an inverting input terminal of a comparison circuit 12 including a comparator and the like.

A threshold output (threshold voltage) read from a lookup table 13 is fed to a non-inverting input terminal of the comparison circuit 12.

The lookup table 13 has a function of reading out a threshold voltage corresponding to the temperature information, based on the temperature information from temperature sensor. That is, a thermistor TH is used for the temperature sensor according to the embodiment as illustrated in FIG. 2, and, to the thermistor TH, a resistive element R1 is connected in series and a DC voltage E1 is applied. A DC voltage generated across the thermistor TH is extracted as the temperature information, and the temperature information is subjected to digital conversion by an A/D converter 14, and is sent to the lookup table 13.

Data of the threshold voltages aa V to zz V corresponding to temperatures aa° C. to zz° C. are stored in the lookup table 13. The threshold voltage data corresponding to the temperature information generated by the thermistor TH read from the lookup table 13 becomes a threshold voltage generated by a D/A converter 16. The comparison circuit 12 compares the threshold voltage with the RSSI output. As a result, the comparator generates a comparison output when the RSSI output becomes lower than the threshold voltage, and supplies the comparison output to the muting circuit 7 as a mute control signal. Thus, the muting circuit 7 operates to close the signal line of the audio signal and to shut off the output of the audio signal.

Figure 4:
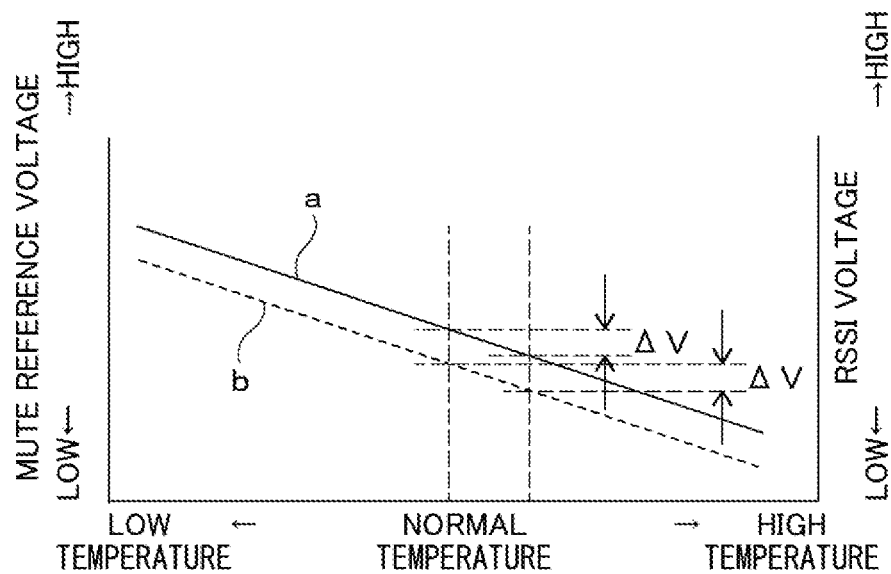
FIG. 4 is a graph illustrating a first operation example of the mute control circuit illustrated in FIG. 2.

FIG. 4 illustrates an operation example of the mute control circuit 9 illustrated in FIG. 2. That is, in FIG. 4, the left vertical axis indicates the mute reference voltage, the right vertical axis indicates the RSSI voltage, and the horizontal axis indicates the operating temperature. The solid line a indicates the RSSI voltage having temperature dependence, and the dashed line b indicates the threshold voltage (mute reference voltage) read from the lookup table 13. At this time, the solid line a and the dashed line b have the same inclination.

As illustrated in FIG. 4, when let a drift voltage in RSSI voltage (solid line a) at each temperature from the RSSI voltage at the normal temperature denote $\Delta V$, if the mute reference voltage (dashed line b) is set to change the same drift voltage of $\Delta V$, then at any temperature the mute reference voltage (dashed line b) will have a constant voltage difference $\Delta V$ with respect to the RSSI voltage (solid line a).

Therefore, making the above setting enables to eliminate variation of mute operation relative to temperature change, and allows to provide the wireless receiver without variation due to the temperature change of the reception reaching distance (which determines the area where the system can be used).

For example, in a case where transmission of the RF signal from the wireless microphone stops, or in a case where a reception frequency radio wave is suppressed by disturbance due to interference of intermodulation, for example, the muting circuit 7 operates and allows normal mute operation to cut off audibly unpleasant noise.

Figure 5:
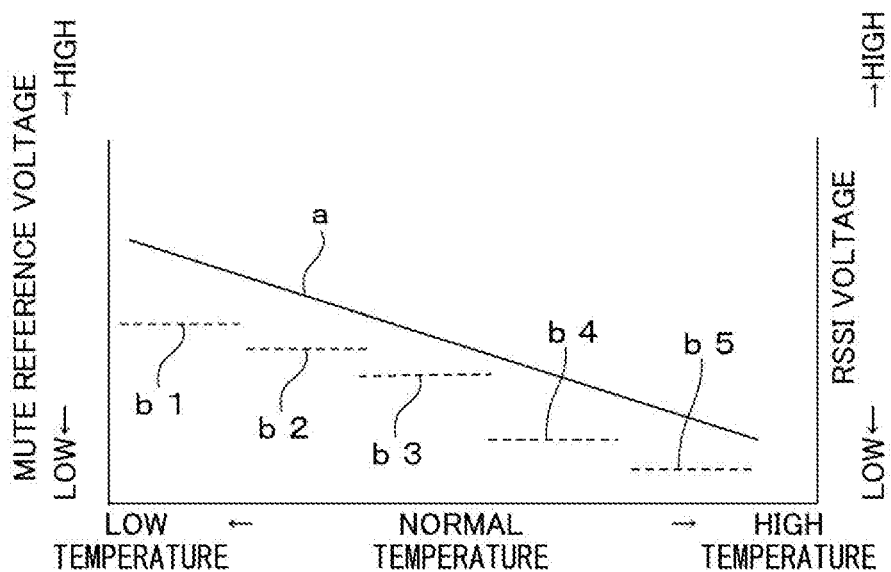
FIG. 5 is a graph illustrating a second operation example of the mute control circuit illustrated in FIG. 2.

FIG. 5 illustrates another operation example of the mute control circuit 9 illustrated in FIG. 2, and the relationship between the vertical axis and the horizontal axis in FIG. 5 is the same as the relationship of the example which is already described illustrated in FIG. 4.

In the example illustrated in FIG. 5, the practical temperature range (horizontal axis in FIG. 5) in which the wireless receiver is used is divided into, for example, five stages, and threshold voltages (mute reference voltages) b1 to b5 are set in correspondence to the respective temperature ranges divided into five stages.

Therefore, with the above setting, a small scale lookup table suffices for the lookup table 13, and a comparable effect can be obtained in practical use to the example illustrated in FIG. 4 with the lookup table 13 having a large number of stored data.

Figure 6:
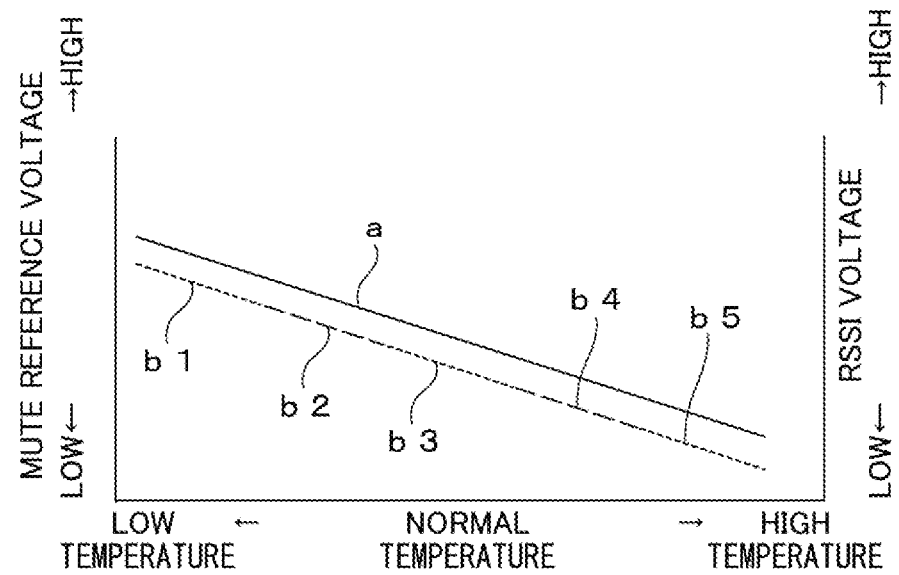
FIG. 6 is a graph illustrating an operation example of the mute control circuit illustrated in FIG. 3.

FIG. 6 illustrates another operation example of the mute control circuit 9, and the relationship between the vertical axis and the horizontal axis in FIG. 6 is the same as the relationship of the example illustrated in FIG. 4 already described.

In the example illustrated in FIG. 6, the practical temperature range (horizontal axis in FIG. 6) in which the wireless receiver is used is divided into, for example, five stages, and threshold voltages (mute reference voltages) b1 to b5 are set in correspondence to the respective temperature ranges divided into five stages.

However, each of the threshold values b1 to b5 illustrated in FIG. 6 has a characteristic that is linearly inclined, and uses a linearly interpolated value by using upper limit and lower limit threshold values read from the lookup table 13. The solid line a and each of the threshold values b1 to b5 have the same inclination.

Figure 3:
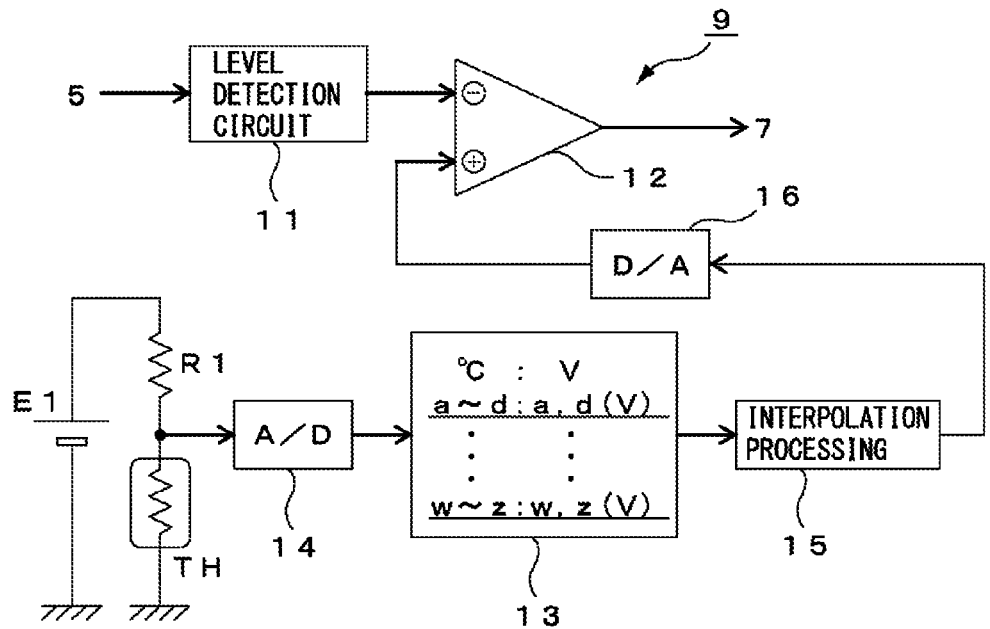
FIG. 3 is a block diagram similarly illustrating a second example of the mute control circuit.

The second configuration example of the mute control circuit 9 that achieves the operation is illustrated in FIG. 3. In a block configuration illustrated in FIG. 3, interpolation processing 15 is added to the configuration illustrated in FIG. 2, and, since other elements are the same as those in FIG. 2, overlapping description is omitted.

That is, in the lookup table 13 in FIG. 3, the threshold value data of the upper limit and lower limit respectively corresponding to the threshold values b1 to b5 illustrated in FIG. 6 are stored for each of the temperature ranges of five stages. For example, regarding the threshold value b1, an upper limit threshold voltage a V and a lower limit threshold voltage d V are stored for a temperatures range from a to d° C.

In correspondence to the temperature range obtained by the temperature sensor including the thermistor TH, the above-described threshold value data of the upper limit and lower limit are read simultaneously. The threshold value data of the upper limit and lower limit are linearly interpolated in the interpolation processing 15 illustrated in FIG. 3, and a threshold voltage (mute reference voltage) corresponding to each temperature is calculated, and a threshold value corresponding to the threshold voltage is supplied to the comparison circuit 12.

Therefore, also in a case where the mute control circuit 9 described based on FIGS. 3 and 6 is used, a small scale lookup table suffices for the lookup table 13, and a comparable effect can be obtained in practical use to the example illustrated in FIG. 4 with the lookup table 13 having a large number of stored data.

Data of the threshold voltages aa V to zz V corresponding to temperatures aa° C. to zz° C. are stored in the lookup table 13. Threshold voltage values corresponding to a temperature range more than aa° C. to less than zz° C. (excluding both end temperatures aa° C. and zz° C.) may be calculated by linear interpolation of interpolation processing 15.

Figure 7:
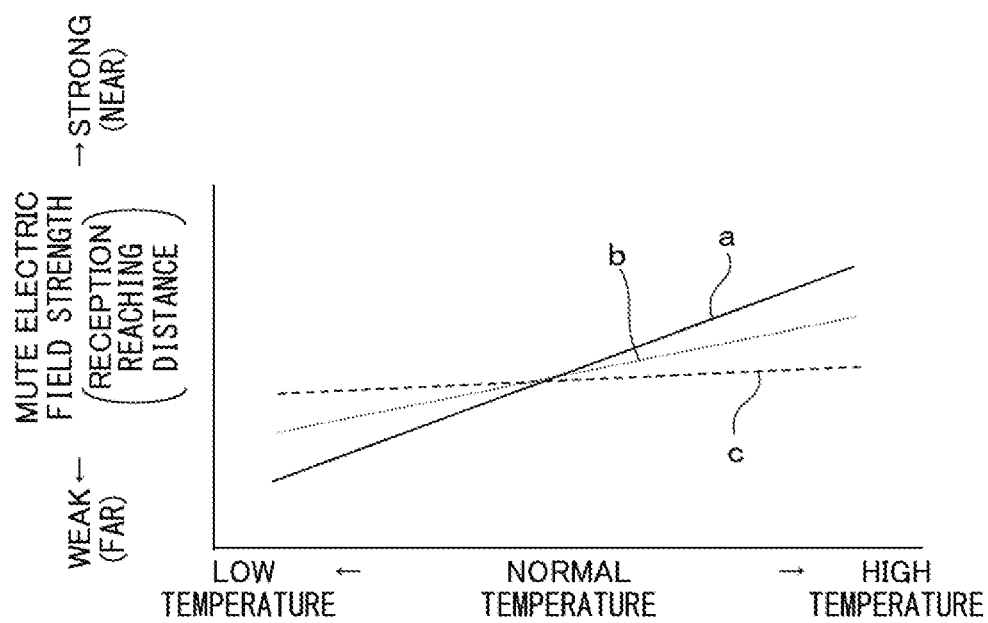
FIG. 7 is a graph comparing a reception reaching distance of the wireless receiver.

FIG. 7 represents a relationship between the operating temperature and the reception reaching distance for the conventional wireless receiver and the wireless receiver according to the present invention. The vertical axis in FIG. 7 indicates the reception reaching distance (within which the system can be used), and the horizontal axis indicates the operating temperature.

Figure 8:
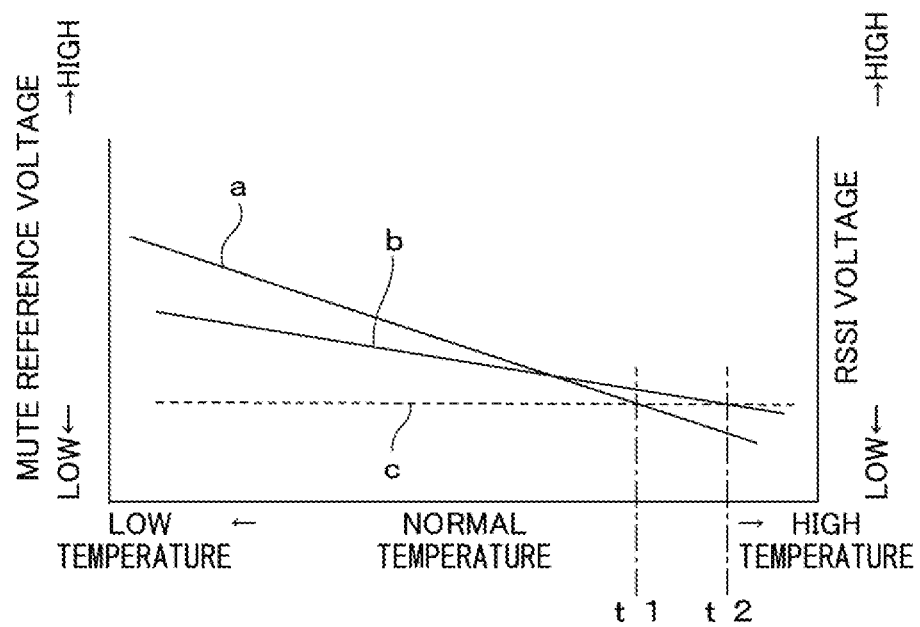
FIG. 8 is a graph illustrating an operation example of a mute control circuit in a conventional wireless receiver.

A characteristic a indicates a reception reaching distance of the conventional wireless receiver using output of the RSSI before correction of the temperature dependence corresponding to the characteristic a in FIG. 8. A characteristic b indicates a reception reaching distance of the conventional wireless receiver using output of the RSSI after correction of the temperature dependence corresponding to the characteristic b in FIG. 8.

A characteristic c indicates a reception reaching distance of the wireless receiver according to the present invention including the threshold voltage (mute reference voltage) corresponding to the characteristic b in FIG. 4, for example.

With the wireless receiver illustrated as a conventional example, the reception reaching distance is decreased in a high-temperature region as illustrated in the characteristics a and b. This is because the RSSI voltage is decreased in the high-temperature region and is below a fixed mute reference voltage, and the muting circuit operates early.

On the other hand, with the wireless receiver according to the present invention, little change is observed in the reception reaching distance within the practical temperature range as illustrated in the characteristic c.

This is a result of reading an appropriate threshold voltage (mute reference voltage) from the lookup table, based on the temperature information, and utilizing the threshold voltage to cancel the temperature characteristic of the RSSI output substantially. Thus, the wireless receiver can be provided capable of eliminating fluctuation of the reception reaching distance relative to temperature change, and ensuring stable mute operation.

In the above-described embodiments, description has been made based on the wireless receiver that receives and demodulates the RF signal from the wireless microphone; however, the wireless receiver according to the present invention can obtain a similar effect when adopted in other wireless receivers that receive and demodulate the RF signal, besides the wireless receiver that receives the RF signal from the above-described particular transmission source.

The level detection circuit 11 and the comparison circuit 12 described in the embodiments can be replaced by a configuration using digital processing.

What is claimed is:

1. A wireless receiver comprising:
    an RSSI generation circuit that obtains RSSI output corresponding to a carrier strength level of a received RF signal;
    a lookup table from which a threshold value corresponding to temperature information from a temperature sensor is read based on the temperature information;
    a comparison circuit that generates comparison output when the RSSI output is below the threshold value read from the lookup table or a value based on the threshold value, wherein the threshold value or the value based on the threshold value is one input, and the RSSI output from the RSSI generation circuit is the other input; and
    a muting circuit that closes a signal line of an audio signal demodulated from the RF signal, and cuts off output of the audio signal, based on the comparison output from the comparison circuit,
    wherein an inclination of the RSSI output relative to temperature and an inclination of the threshold value corresponding to the temperature information of the lookup table are equal to each other.

2. The wireless receiver according to claim 1, wherein the one input of the comparison circuit is a value linearly interpolated by using the threshold value read from the lookup table.

3. The wireless receiver according to claim 1, wherein a thermistor is used for the temperature sensor.

4. A wireless receiver comprising:
    an RSSI generation circuit that obtains RSSI output corresponding to a carrier strength level of a received RF signal;
    a lookup table from which a threshold value corresponding to temperature information from a temperature sensor is read based on the temperature information;
    a comparison circuit that generates comparison output when the RSSI output is below the threshold value read from the lookup table or a value based on the threshold value, wherein the threshold value or the value based on the threshold value is one input, and the RSSI output from the RSSI generation circuit is the other input; and
    a muting circuit that closes a signal line of an audio signal demodulated from the RF signal, and cuts off output of the audio signal, based on the comparison output from the comparison circuit,
    wherein an amount of temperature drift of the RSSI output from a normal temperature is same as an amount of temperature drift of the threshold value from the normal temperature corresponding to temperature information in the lookup table.

5. The wireless receiver according to claim 4, wherein the one input of the comparison circuit is a value linearly interpolated by using the threshold value read from the lookup table.

6. The wireless receiver according to claim 4, wherein a thermistor is used for the temperature sensor.

* * * * *